United States Patent
Lee et al.

(10) Patent No.: US 10,038,160 B2
(45) Date of Patent: Jul. 31, 2018

(54) ORGANIC LIGHT EMITTING DEVICE

(71) Applicant: SAMSUNG DISPLAY CO., LTD., Yongin-si, Gyeonggi-do (KR)

(72) Inventors: Joon Gu Lee, Seoul (KR); Jae Ik Kim, Seoul (KR); Yeon Hwa Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 184 days.

(21) Appl. No.: 15/160,911

(22) Filed: May 20, 2016

(65) Prior Publication Data
US 2017/0084862 A1    Mar. 23, 2017

(30) Foreign Application Priority Data

Sep. 17, 2015 (KR) .......................... 10-2015-0131863

(51) Int. Cl.
*H01L 51/52* (2006.01)
*H01L 27/32* (2006.01)
*H01L 27/12* (2006.01)

(52) U.S. Cl.
CPC ...... *H01L 51/5212* (2013.01); *H01L 51/5215* (2013.01); *H01L 51/5221* (2013.01); *H01L 27/1248* (2013.01); *H01L 27/3246* (2013.01); *H01L 27/3248* (2013.01); *H01L 27/3258* (2013.01); *H01L 27/3262* (2013.01); *H01L 2251/301* (2013.01); *H01L 2251/303* (2013.01); *H01L 2251/305* (2013.01); *H01L 2251/306* (2013.01); *H01L 2251/308* (2013.01); *H01L 2251/558* (2013.01)

(58) Field of Classification Search
CPC ............. H01L 51/5212; H01L 51/5215; H01L 51/5221; H01L 2251/303; H01L 27/3246; H01L 27/3262; H01L 27/3248; H01L 2251/305; H01L 27/3258; H01L 2251/558; H01L 2251/308; H01L 2251/306; H01L 2251/301
USPC ......................................................... 257/40
See application file for complete search history.

(56) References Cited

U.S. PATENT DOCUMENTS 6,917,159 B2    7/2005   Tyan et al.
2006/0255719 A1*  11/2006  Oikawa ............... H01L 51/5206
                                                    313/503

(Continued)

FOREIGN PATENT DOCUMENTS

JP       2006-244850 A    9/2006
KR    10-2004-0066721 A    7/2004

(Continued)

*Primary Examiner* — Fernando L Toledo
*Assistant Examiner* — Adam S Bowen
(74) *Attorney, Agent, or Firm* — Lewis Roca Rothgerber Christie LLP

(57) ABSTRACT

According to an exemplary embodiment of the present disclosure, an organic light emitting element includes: a first electrode; an organic emission layer disposed on the first electrode; and a second electrode disposed on the organic emission layer. The first electrode includes a first sub-electrode including a first metal, a second sub-electrode disposed on the first sub-electrode and including a transparent conductive material, and a barrier layer disposed on the second sub-electrode and including a second metal in the form of an oxide.

12 Claims, 8 Drawing Sheets

(56) References Cited

U.S. PATENT DOCUMENTS

| | | | |
|---|---|---|---|
| 2009/0160325 A1* | 6/2009 | Yatsunami | C09K 11/06 313/504 |
| 2011/0248259 A1* | 10/2011 | Oh | H01L 51/5088 257/43 |
| 2014/0097420 A1* | 4/2014 | Lee | H01L 27/3279 257/40 |

FOREIGN PATENT DOCUMENTS

| | | |
|---|---|---|
| KR | 10-2008-0042887 A | 5/2008 |
| KR | 10-2008-0061732 A | 7/2008 |
| KR | 10-2012-0004193 A | 1/2012 |

\* cited by examiner

ORGANIC LIGHT EMITTING DEVICE

CROSS-REFERENCE TO RELATED APPLICATION

This application claims priority to and the benefit of Korean Patent Application No. 10-2015-0131863, filed in the Korean Intellectual Property Office on Sep. 17, 2015, the entire content of which is incorporated herein by reference.

BACKGROUND (a) Field

The present disclosure relates to an organic light emitting element.

(b) Description of the Related Art

Organic light emitting diode (OLED) displays have received much attention as display devices for displaying images.

A conventional organic light emitting diode display includes a first substrate having an organic light emitting diode thereon and a second substrate disposed to face the first substrate and which protects the organic light emitting diode on the first substrate. The organic light emitting diode includes an organic emission layer for emitting light, and a first electrode and a second electrode that face each other, with the organic emission layer interposed therebetween.

The organic light emitting diode display may be classified into a top emission display, in which light emitted from the organic light emitting diode is irradiated in the direction of the second substrate, a bottom emission display, in which light emitted from the organic light emitting diode is irradiated in the direction of the first substrate, and a double-sided emission display, in which light emitted from the organic light emitting diode is irradiated in both the direction of the first substrate and the direction of the second substrate.

Among them, the organic light emitting diode of the top emission display has a structure in which the first electrode is light reflective and the second electrode is semi-transmissive. Such a top emission organic light emitting diode display has a microcavity structure.

The microcavity structure serves to improve the light efficiency (e.g., light emitting efficiency) of each red, green, or blue light (that is emitted by each organic emission layer) by implementing a kind of color filter effect. As a result, the thickness of each organic emission layer that emits red, green, or blue light is limited, and thus the thickness is determined (e.g., constantly determined) to suit the wavelength of a color of light which each organic emission layer emits.

However, when the thickness of the organic emission layer is thin (e.g., determined to be thin) to suit the wavelength of the color of the light that each organic emission layer emits, black spots and cell defectiveness occur due to sub-micrometer particles, which may be positioned on a surface of the first electrode.

The above information disclosed in this Background section is only to enhance the understanding of the background of the invention, and therefore it may contain information that does not form the prior art that is already known to a person of ordinary skill in the art.

SUMMARY

The present disclosure has been made in an effort to provide an organic light emitting diode display having features of being capable of improving light efficiency of light emitted by an organic emission layer, and reducing or minimizing black spots generated in an organic light emitting element.

According to an exemplary embodiment of the present disclosure, an organic light emitting element includes: a first electrode; a second electrode overlapping the first electrode; and an emission layer between the first electrode and the second electrode, wherein the first electrode includes a first sub-electrode including a first metal, a second sub-electrode on the first sub-electrode and including a transparent conductive material, and a barrier layer on the second sub-electrode and including a second metal in a form of an oxide.

The second metal may be a lanthanide metal or a transition metal having a work function that is larger than that of the first metal.

The work function of the barrier layer may be equal to or greater than about 5.40 eV.

The first metal may include at least one selected from silver (Ag), gold (Au), aluminum (Al), copper (Cu), a silver alloy, a gold alloy, an aluminum alloy, and a copper alloy.

The second sub-electrode may include at least one selected from an indium oxide, a tin oxide, a zinc oxide, a gallium oxide, and a silicon oxide.

The barrier layer may include an ytterbium oxide or a samarium oxide.

A thickness of the barrier layer may be in a range of 1 nm to 15 nm.

The organic emission layer may further include a hole transferring region between the first electrode and the emission layer and an electron transferring region between the second electrode and the emission layer.

The hole transferring region may include a hole-injection layer and a hole-transporting layer, and the electron transferring region may include an electron-transporting layer and an electron-injection layer.

The emission layer may include any one of a red organic emission layer, a green organic emission layer, a blue organic emission layer, and a white organic emission layer.

The first electrode may be a light-reflective electrode, and the second electrode may be a light-transflective electrode.

According to the exemplary embodiment of the present disclosure, it is possible to provide an organic light emitting element capable of improving light efficiency and reducing or minimizing the generation of black spots.

DETAILED DESCRIPTION

Figure 1:
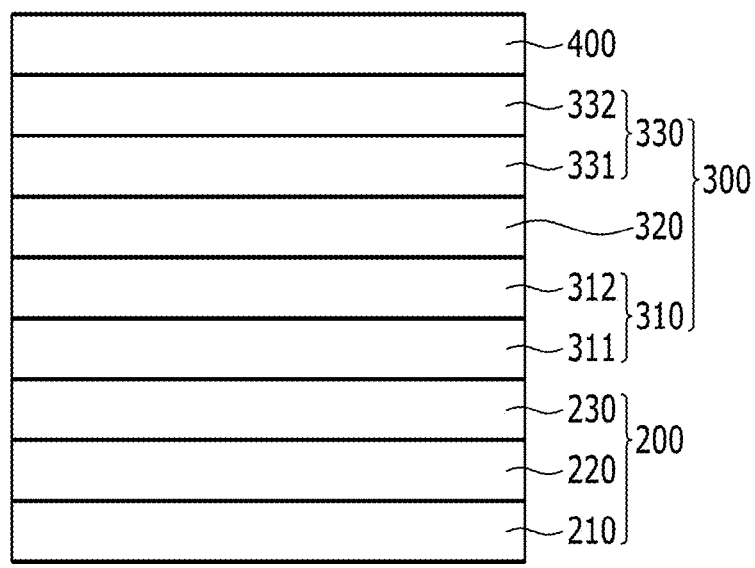
FIG. 1 schematically illustrates an organic light emitting element according to an exemplary embodiment of the present disclosure.

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

In the drawings, the thicknesses of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising", will be understood to imply the inclusion of stated elements but not the exclusion of any other elements. Further, in the specification, the word "on" refers to positioning on or below the object portion, but does not essentially refers to positioning on the upper side of the object portion based on a direction of gravity.

Hereinafter, an organic light emitting element according to an exemplary embodiment of the present disclosure will be described with reference to FIG. 1.

FIG. 1 schematically illustrates an organic light emitting element according to an exemplary embodiment of the present disclosure.

As shown in FIG. 1, the organic light emitting element according to the exemplary embodiment of the present disclosure includes a first electrode 200, an emission element layer 300 disposed on the first electrode 200, and a second electrode 400 disposed on the emission element layer 300.

The first electrode 200 may be connected to one drain electrode of one of a plurality of thin film transistors through a contact hole formed in an insulating layer. The first electrode 200 is an anode serving as a hole injection electrode, and it serves as a light-reflective electrode. The first electrode 200 includes a first sub-electrode 210, which serves as a light-reflective layer, a second sub-electrode 220 including a transparent conductive material, and a barrier layer 230.

The first sub-electrode 210 which serves as the light-reflective layer includes a first metal. In the present exemplary embodiment, the first sub-electrode 210 including the first metal may include at least one of silver (Ag), a silver (Ag) alloy, gold (Au), a gold (Au) alloy, aluminum (Al), an aluminum (Al) alloy, copper (Cu) and a copper (Cu) alloy, and may be formed to have a single layer or multiple layers.

The second sub-electrode 220 is disposed on the first sub-electrode 210. In the present exemplary embodiment, the second sub-electrode 220 is a light-transmitting conductive layer, and may be a single layer or multiple layers including at least one selected from an indium oxide, a tin oxide, a zinc oxide, a gallium oxide, and a silicon oxide. For example, the second sub-electrode 220 may include an indium tin oxide (ITO), an indium zinc oxide (IZO), and/or the like.

The barrier layer 230 is disposed on the second sub-electrode 220. In the present exemplary embodiment, the barrier layer 230 includes a second metal, a work function of which is greater than that of the first metal included in the first sub-electrode 210. For example, in the present exemplary embodiment, the barrier layer 230 includes the second metal in the form of an oxide, and the work function of the barrier layer 230 including the second metal oxide is in a range of about 5.40 eV to about 6.0 eV.

For example, in the present exemplary embodiment, the second metal includes one of a lanthanide metal or a transition metal; and the barrier layer 230 includes an ytterbium oxide, a samarium oxide, or the like.

In the present exemplary embodiment, the barrier layer 230 is disposed above the first sub-electrode 210 serving as the light-reflective layer and the second sub-electrode 220 including the transparent conductive material, and thus it is possible to reduce or minimize pixel black spots of the organic light emitting element generated by ejection of the first metal such as silver (Ag) (e.g., ejection of particles of the first metal) included in the first sub-electrode 210 serving as the light-reflective layer.

In the present exemplary embodiment, a thickness of the barrier layer 230 is in a range of about 1 nm to about 15 nm. In the present exemplary embodiment, when the barrier layer 230 is formed to have a thickness that is less than about 1 nm, it may be difficult to efficiently reduce or prevent the ejection of the first metal such as silver (Ag) included in the first sub-electrode 210. Further, when the thickness of the barrier layer 230 exceeds 15 nm, a light transmitting efficiency may deteriorate due to the second metal oxide included in the barrier layer 230.

In the present exemplary embodiment, the second sub-electrode 220 including the transparent conductive material has been described to be formed between the first sub-electrode 210 and the barrier layer 230, but the present exemplary embodiment is not limited thereto. For example, the first electrode 200 may be formed such that the barrier layer 230 is positioned immediately above the first sub-electrode 210 serving as the light-reflective layer including the first metal.

The emission element layer 300 is disposed on the first electrode 200 to correspond to an emission area of the first electrode 200. The emission element layer 300 may include a low molecular weight organic material or a high molecular weight organic material, such as PEDOT (poly(3,4-ethylenedioxythiophene)), or the like.

The emission element layer 300 may include a hole transferring region 310 disposed on the first electrode 200, an emission layer 320 disposed on the hole transferring region 310, and an electron transferring region 330 disposed on the emission layer 320.

The hole transferring region 310 may be formed of multiple layers in which a first sub-layer 311 and a second sub-layer 312 (including at least one of a hole injection layer (HIL) and a hole transporting layer (HTL)) are stacked.

The emission layer 320 respectively contacts the hole transferring region 310 and the electron transferring region 330, and is between the hole transferring region 310 and the electron transferring region 330.

In the present exemplary embodiment, the emission layer 320 may include a red organic emission layer for emitting red light, a green organic emission layer for emitting green light, and a blue organic emission layer for emitting blue light, and the red organic emission layer, the green organic emission layer, and the blue organic emission layer are respectively formed in a red pixel, a green pixel, and a blue pixel, thereby realizing a color image. The emission layer 320 may implement the color image by integrally laminating all of the red organic emission layer, the green organic emission layer, and the blue organic emission layer in the red pixel, the green pixel, and the blue pixel and by respectively forming a red color filter, a green color filter, and a blue color filter in each pixel.

Further, in the present exemplary embodiment, a white organic emission layer for emitting white light serving as the emission layer 320 may be formed in each of the red pixel, the green pixel, and the blue pixel; and a red color filter, a green color filter, and a blue color filter may be respectively formed for every pixel to thereby implement a color image. When the color image is implemented by using the white organic emission layer serving as the emission layer 320 and the color filter, a deposition mask for depositing the red organic emission layer, the green organic emission layer, and the blue organic emission layer on individual pixels, i.e., the red pixel, the green pixel, and the blue pixel, is not required. The white organic emission layer serving as the emission layer 320 may be formed to have a single organic emission layer, and may further include a configuration in which a plurality of organic emission layers are stacked to emit white light. For example, the emission layer 320 may include a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light.

The electron transferring region 330 may be formed of multiple layers in which a third sub-layer 331 and a fourth sub-layer 332, including at least one of an electron transporting layer (ETL) and an electron injection layer (EI), are stacked.

In the present exemplary embodiment, the second electrode 400 is a cathode and serves as an electron injection electrode and a light transflective electrode. The second electrode 400 may be formed to have a thickness that is in a range of 5 nm to 20 nm in order to realize light transflection. When formed to have a thickness that is less than 5 nm, the second electrode 400 may be formed in an island-like shape (e.g., disconnected patches), which may cause a hole (e.g., a gap) to be unexpectedly formed in the second electrode 400. When formed to have the thickness that exceeds 20 nm, light that is emitted from the emission element layer 300 and is supposed to transmit through the second electrode 400 may be blocked by the second electrode 400, thereby deteriorating the luminance of the light emitted from the emission element layer 300.

The described first electrode 200, emission element layer 300, and second electrode 400 respectively contact each other.

Hereinafter, an emission effect of an organic light emitting element and an effect of reducing or minimizing black spots that may be generated on the first electrode 200 according to an exemplary embodiment of the present disclosure will be described.

In the organic light emitting element according to the present exemplary embodiment, the barrier layer 230 may be formed to have a constant (e.g., substantially constant) thickness on the first sub-electrode 210 and the second sub-electrode 220, thereby reducing or preventing ejection of the first metal included in the first sub-electrode 210. Accordingly, it is possible to improve the reliability of the organic light emitting element and suppress or reduce black spot generation.

In this case, as described above, the barrier layer 230 according to the present exemplary embodiment may include the second metal in the form of an oxide. For example, in the present exemplary embodiment, the second metal is one of a lanthanide metal or a transition metal.

When the second metal included in the barrier layer 230 exists in a metallic state, the second metal has a low light reflectance and a high absorption. Accordingly, reflectivity of the first sub-electrode 210 serving as a light-reflective layer is significantly deteriorated. Accordingly, the barrier layer 230 may be formed by a lanthanide metal or a transition metal having a large atomic number and an excellent film formation characteristic, and by exposing it to the atmosphere or using a surface treatment with UV-ozone, $O_2$ plasma, or the like.

The barrier layer 230 has a transmittance characteristic and a hole injection characteristic that is further improved compared to a conventional organic light emitting element including a light-reflecting electrode. The details thereof will be described with reference to FIG. 2 and FIG. 3.

Figure 2:
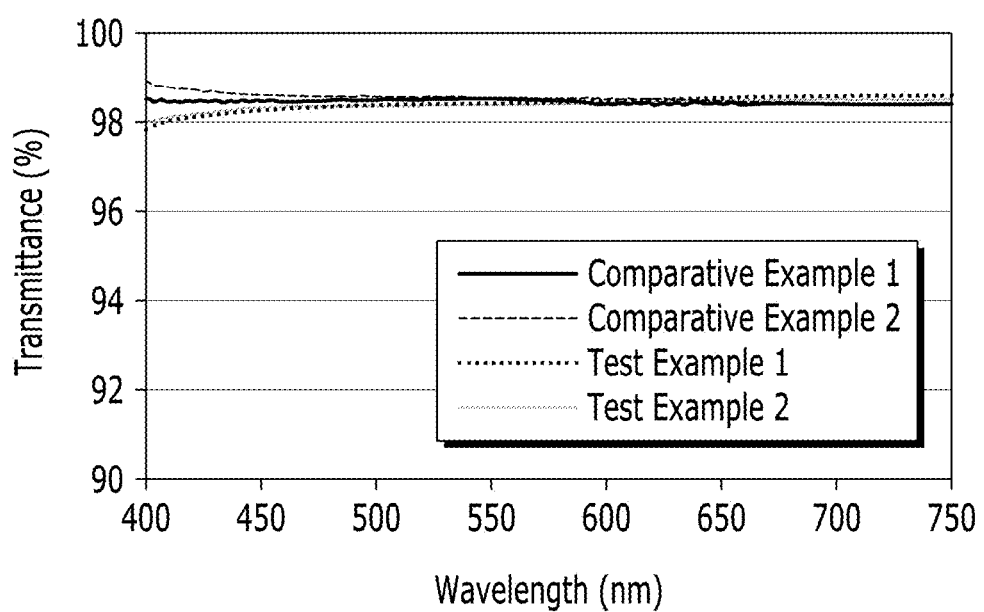
FIG. 2 is a graph illustrating an effect of an organic light emitting element according to an exemplary embodiment of the present disclosure.

FIG. 2 is a graph illustrating transmittances according to wavelengths of Comparative Examples 1 and 2 and Test Examples 1 and 2.

In Comparative Example 1 and Comparative Example 2, ytterbium (Yb) was formed as the barrier layer 230 to have a thickness of 15 Å and 30 Å, respectively. In Test Example 1 and Test Example 2, an ytterbium oxide obtained by performing a UV-ozone surface treatment on ytterbium (Yb) was formed as the barrier layer 230 to have a thickness of 15 Å and 30 Å, respectively.

Test Example 1 and Test Example 2 show lower transmittance at a low wavelength region than Comparative Example 1 and Comparative Example 2, and show minute differences thereafter or maintain higher transmittances than Comparative Example 1 and Comparative Example 2, which show transmittances that are substantially close to 100%.

Further, in the present exemplary embodiment, since the barrier layer 230 has the second metal oxide (e.g., the second metal in the oxide form), the barrier layer 230 shows a higher work function than when having the second metal as the metallic form. The details thereof will be described with reference to FIG. 3.

Figure 3:
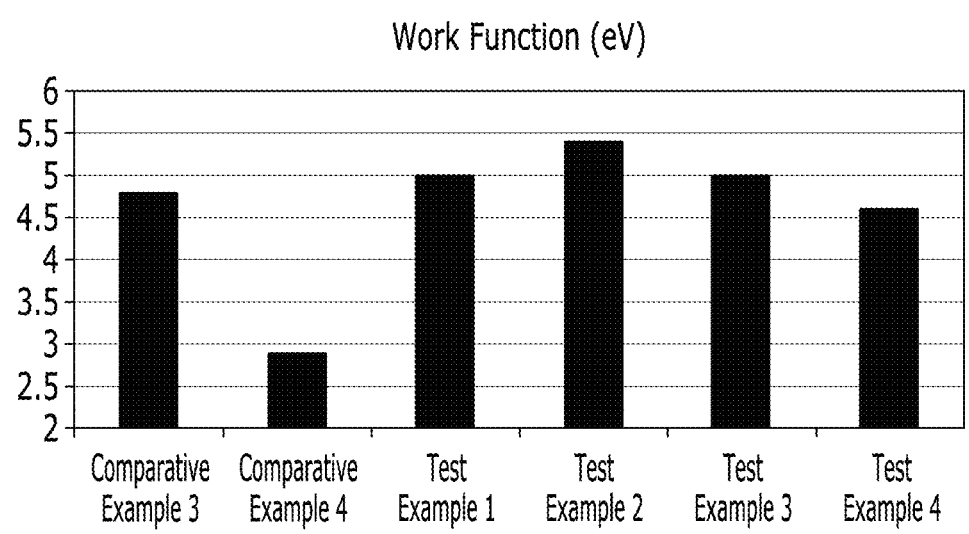
FIG. 3 is a graph illustrating an effect of an organic light emitting element according to an exemplary embodiment of the present disclosure.

FIG. 3 is a graph illustrating work functions according to Comparative Examples 3 and 4 and Test Examples 1 to 4.

In this case, in Comparative Example 3, the first electrode 200 was made of indium tin oxide (ITO), and in Comparative Example 4, ytterbium (Yb) was formed as the barrier layer 230 of the present exemplary embodiment. Test Examples 1 and 2 are the same as described above. In Test Examples 3 and 4, ytterbium (Yb) was exposed to the atmosphere and was disposed to have a thickness of 15 Å and 30 Å, respectively.

Referring to FIG. 3, in the case of Comparative Example 4, in which ytterbium (Yb) is formed in the metallic form as the barrier layer 230, the work function is about 2.9 eV, which is significantly lower than the other Test Examples, and thus is not appropriate for the hole injection of the first electrode 200. However, as in Test Examples 1 to 4, when ytterbium (Yb) is formed in the oxide form, the work function is in a range of about 4.5 to about 5.5 eV, which is high. Accordingly, in the case of Test Examples 1 to 4, it is possible to acquire a surface that is in a desired position for hole injection compared to Comparative Example 4, in which unoxidized ytterbium (Yb) is formed on the first electrode 200. Accordingly, the organic light emitting element including the barrier layer 230 of Test Examples 1 to 4 can have an effect of increasing an emission efficiency as the hole injection characteristic is improved.

Next, an effect of reducing black spot generation of an organic light emitting element according to an exemplary embodiment of the present disclosure will be described with reference to FIG. 4 to FIG. 7.

Figure 4:
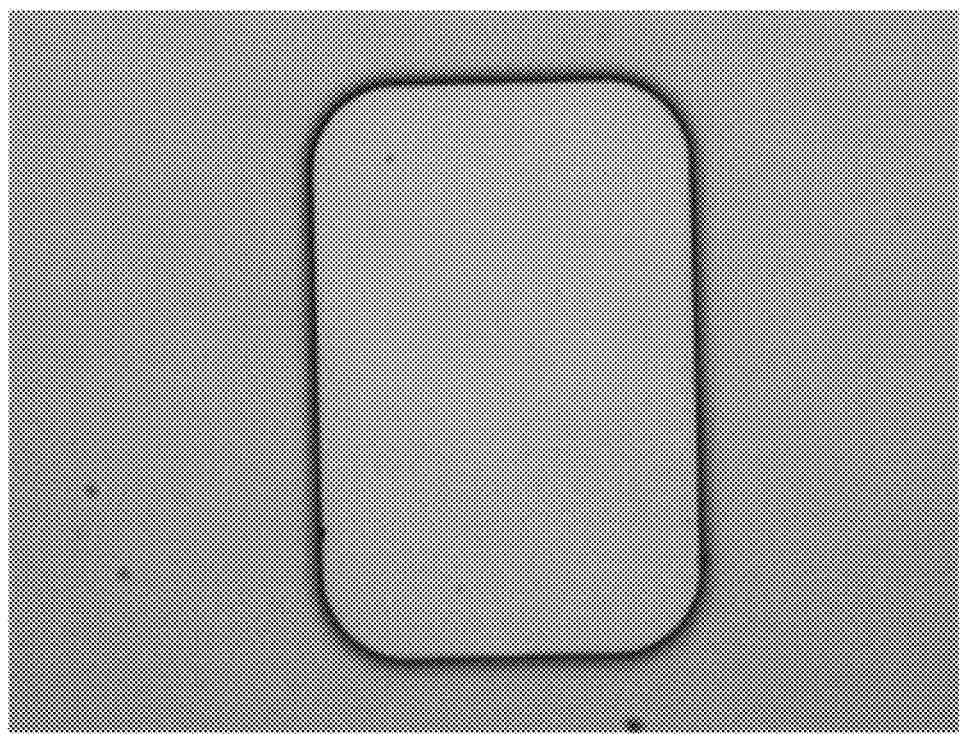
FIG. 4 and FIG. 5 are pictures illustrating surface variation of a first electrode according to time in a Comparative Example.
Figure 5:
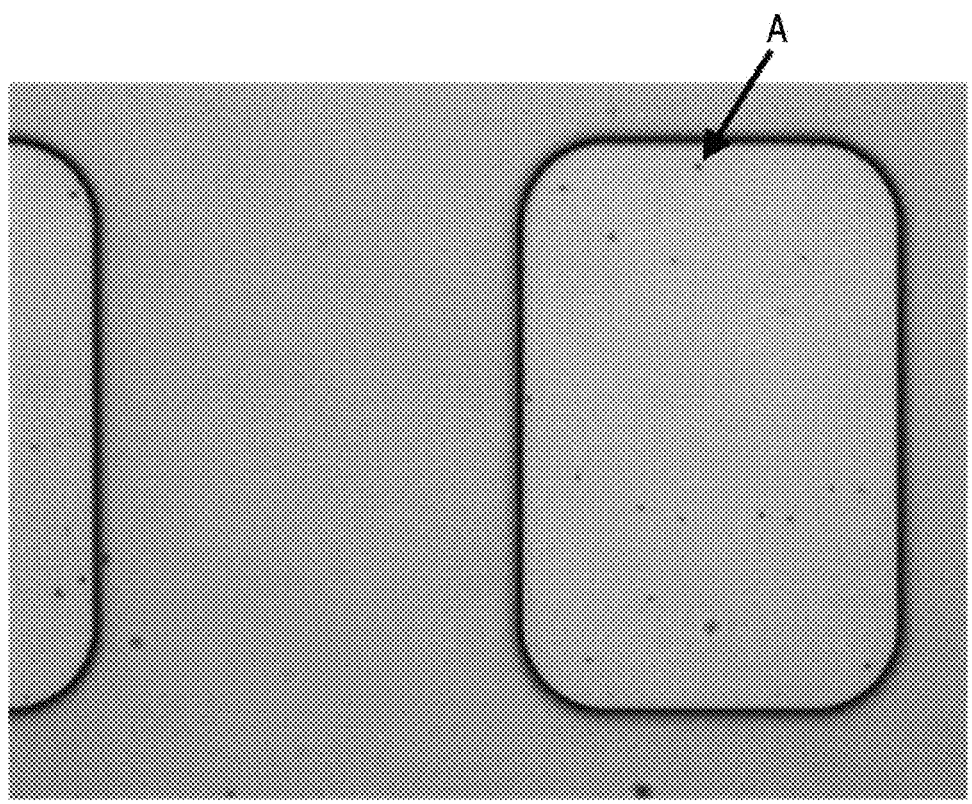

FIG. 4 and FIG. 5 are pictures illustrating a surface of a first electrode including no barrier layers. Specifically, FIG. 5 is a picture illustrating the surface of the first electrode (shown in FIG. 4) after 72 hours.

Figure 6:
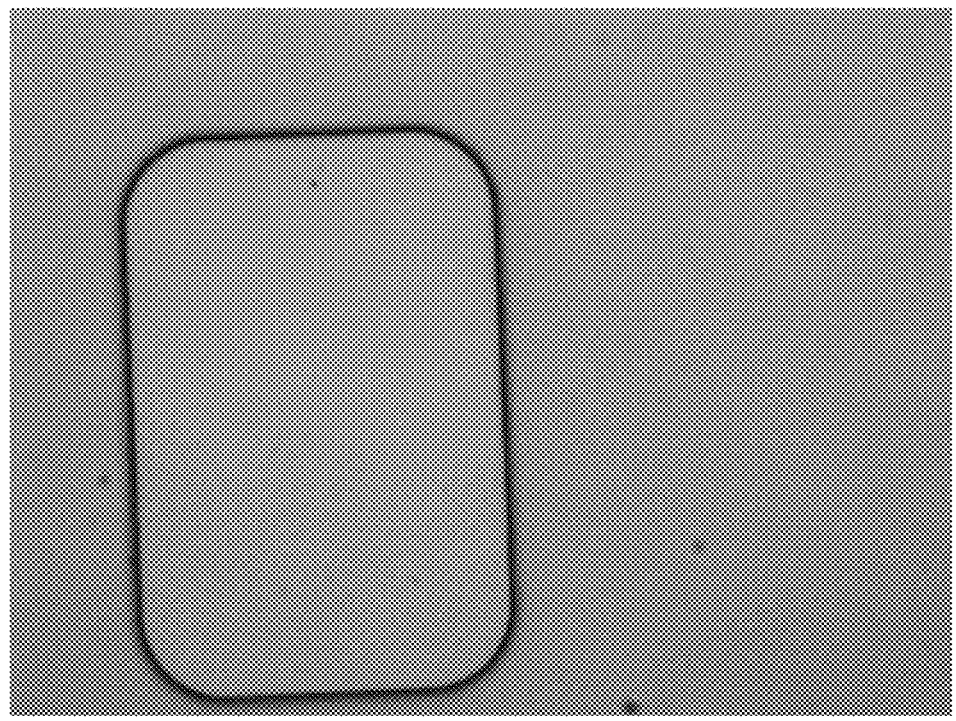
FIG. 6 and FIG. 7 are pictures illustrating surface variation of a first electrode according to time in a Test Example.
Figure 7:
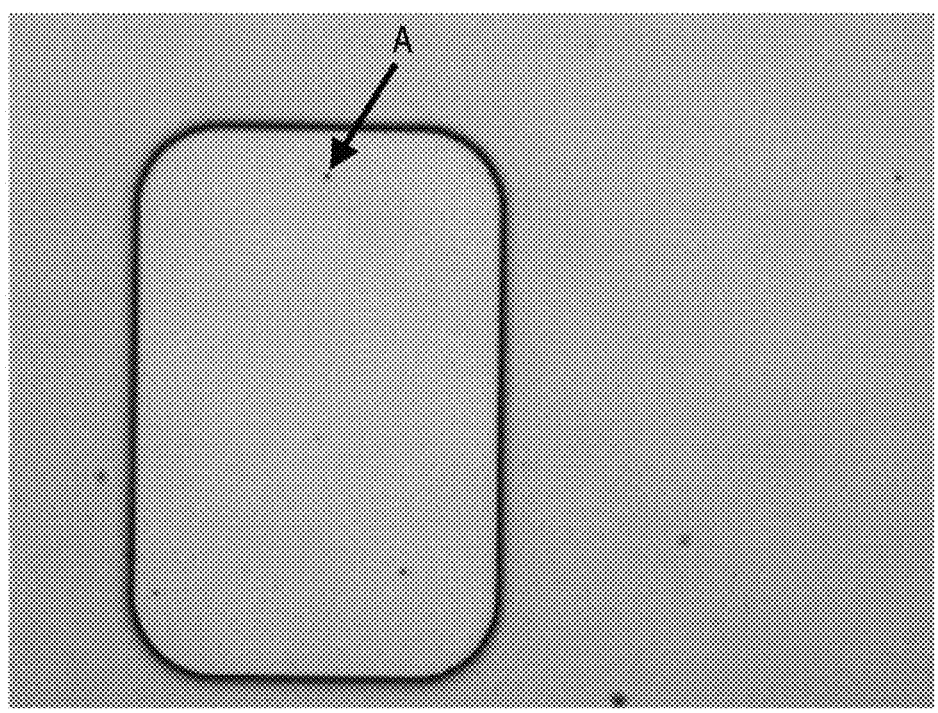

FIG. 6 and FIG. 7 are pictures illustrating a surface of a first electrode including a barrier layer according to an exemplary embodiment of the present disclosure. Specifically, FIG. 7 is a picture illustrating the surface of the first electrode (shown in FIG. 6) after 72 hours.

More specifically, FIG. 4 and FIG. 5 illustrate the case in which the first sub-electrode 210 and the second sub-electrode 220 are respectively formed of silver (Ag) and ITO.

Referring to and comparing FIG. 4 and FIG. 5, several black spots A are generated on the surface of the first electrode after 72 hours. The black spots shown in FIG. 5 are generated as silver particles are ejected over the first sub-electrode 210 or the second sub-electrode 220.

However, comparing FIG. 6 and FIG. 7, in the case of the organic light emitting element including the barrier layer 230 according to the present exemplary embodiment, even after 72 hours, substantially fewer spots A are generated by the ejection of silver particles over the surface of the first electrode.

Regardless of whether the barrier layer according to the present exemplary embodiment is provided, no black spots (or substantially no black spots) are generated in the pictures of the first electrode shown in FIG. 4 and FIG. 6. However, by comparing the pictures of FIG. 5 and FIG. 7 (pictures taken after 72 hours), a difference between the numbers of the generated black spots can be clearly observed (e.g., clearly occurs).

As described above, the organic light emitting element according to the present exemplary embodiment can improve light efficiency thereof and reduce or minimize generation of black spots by including the barrier layer 230 in the first electrode 200.

Hereinafter, an organic light emitting diode display including an organic light emitting element according to an exemplary embodiment of the present disclosure will be described with reference to FIG. 8.

Figure 8:
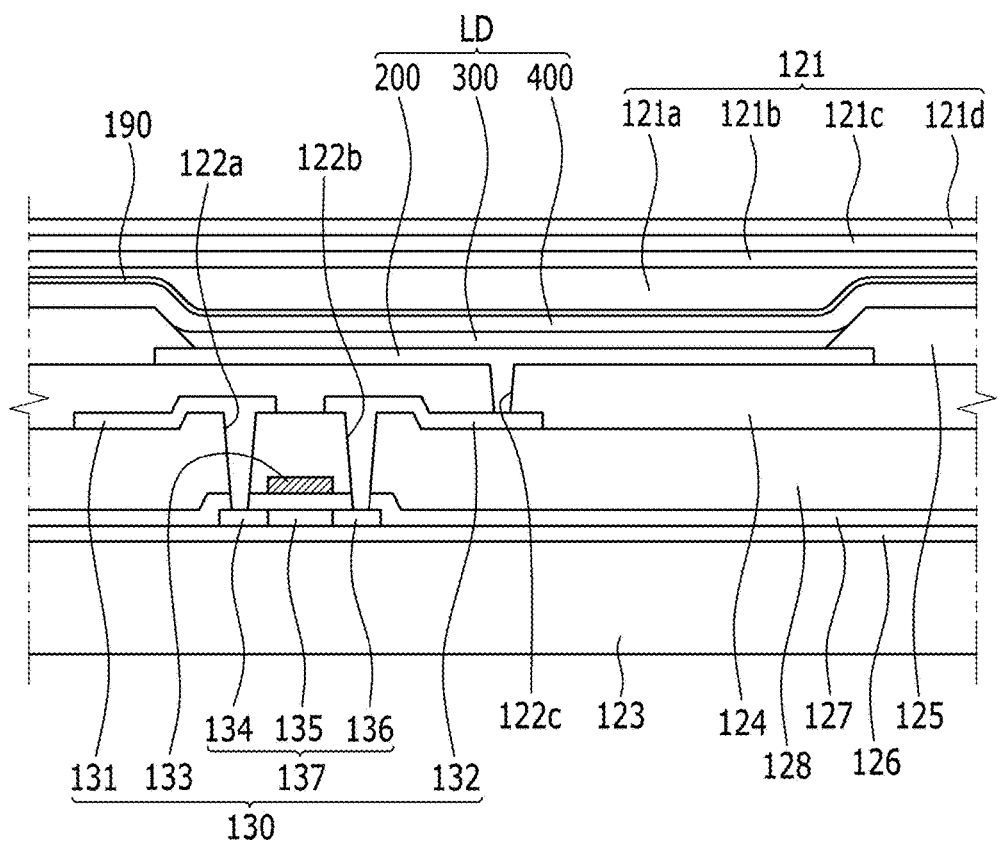
FIG. 8 is a cross-sectional view illustrating an organic light emitting diode display according to an exemplary embodiment of the present disclosure.

FIG. 8 is a cross-sectional view illustrating an organic light emitting diode including an organic light emitting element LD according to an exemplary embodiment of the present disclosure.

Herein, a substrate 123 may be an insulating substrate including glass, polymer, stainless steel, or the like. For example, the substrate 123 may be made of an inorganic material (such as glass); or an organic material (such as polycarbonate, polymethyl methacrylate, polyethylene terephthalate, polyethylene naphthalate, polyamide, polyether sulfone, polyimide, or combinations thereof), and a silicon wafer, etc.

At least one gate wire, at least one data wire, a plurality of thin film transistors, and at least one capacitor may be formed on the substrate 123, and these consistent elements may have various suitable structures.

A substrate buffer layer 126 may be provided on the substrate 123. The substrate buffer layer 126 reduces or prevents infiltration of impurities and planarizes a surface.

In this case, the substrate buffer layer 126 may be made of various suitable materials capable of performing the function described above. For example, the substrate buffer layer 126 may be any one of a silicon nitride (SiNx) film, a silicon oxide (SiOy) film, or a silicon oxynitride (SiOxNy) film. However, the substrate buffer layer 126 is not a necessary component and may not be provided depending on the type and the process conditions of the substrate 123.

A driving semiconductor layer 137 is formed on the substrate buffer layer 126. The driving semiconductor layer 137 may be made of a material including polysilicon. The driving semiconductor layer 137 includes a channel region 135 not doped with impurities, as well as a source region 134 and a drain region 136 formed by doping at both sides of the channel region 135. The doped ion materials are P-type impurities such as boron (B) and $B_2H_6$, which are usually used. Herein, the impurities depend on the type of the thin film transistor.

A gate insulating layer 127 made of silicon nitride (SiNx) or silicon oxide (SiOy) is provided on the driving semiconductor layer 137. A gate wire including a driving gate electrode 133 is provided on the gate insulating layer 127. The driving gate electrode 133 overlaps at least part of the driving semiconductor layer 137, for example, the channel region 135.

An interlayer insulating layer 128 for covering the gate electrode 133 is formed on the gate insulating layer 127. A first contact hole 122a and a second contact hole 122b that expose the source region 134 and the drain region 136 of the driving semiconductor layer 137 are formed in the gate insulating layer 127 and the interlayer insulating layer 128. The interlayer insulating layer 128, similar to the gate insulating layer 127, may be made of silicon nitride (SiNx) or silicon oxide (SiOy).

A data wire including a driving source electrode 131 and a driving drain electrode 132 may be provided on the interlayer insulating layer 128. The driving source electrode 131 and the driving drain electrode 132 are connected to the source region 134 and the drain region 136 of the driving semiconductor layer 137 through the first contact hole 122a and the second contact hole 122b formed in the interlayer insulating layer 128 and the gate insulating layer 127, respectively.

The driving thin film transistor 130 is formed by (e.g., includes) the driving semiconductor layer 137, the driving gate electrode 133, the driving source electrode 131, and the driving drain electrode 132. The configuration of the driving thin film transistor 130 is not limited to the example described above and may be modified in various suitable ways generally available in the art to be easily achieved by those skilled in the art.

A planarizing layer 124 for covering the data wire is formed on the interlayer insulating layer 128. The planarizing layer 124 planarizes a surface by removing a step to increase emission efficiency of an organic light emitting diode to be formed thereon. The planarizing layer 124 includes a third contact hole 122c for exposing part of the drain electrode 132.

The planarizing layer 124 may, for example, be made of one or more selected from polyacrylate resin, epoxy resin, phenolic resin, polyamide resin, polyimide resin, unsaturated polyester resin, poly-phenylenether resin, poly-phenylenesulfide resin, and benzocyclobutene (BCB).

An exemplary embodiment of the present disclosure is not limited to the structure described above, and if necessary, any one of the planarizing layer 124 and the interlayer insulating layer 128 may not be provided.

In this case, a first electrode 200 of the organic light emitting diode, i.e., pixel electrode 200, is provided on the planarizing layer 124. That is, the organic light emitting display device includes a plurality of pixel electrodes 200 respectively disposed in a plurality of pixels. The pixel electrodes 200 are spaced apart from each other. The pixel electrodes 200 are connected to the drain electrode 132 through the third contact hole 122c of the planarizing layer 124.

A pixel defining layer 125 having an opening that exposes the pixel electrodes 200 is positioned on the planarizing layer 124. That is, a plurality of openings respectively corresponding to the pixels are formed between the pixel defining layers 125. An emission element layer 300 may be provided in each of the openings formed by the pixel defining layers 125. Accordingly, pixel regions where the emission element layer 300 is formed may be defined by the pixel defining layers 125.

Thus, the pixel electrodes 200 are disposed to correspond to the opening of the pixel defining layer 125. However, the pixel electrodes 200 are not disposed to correspond only to the opening of the pixel defining layer 125, but a portion of the pixel electrodes 200 may be disposed under the pixel defining layer 125 so that the pixel defining layer 125 overlaps them.

The pixel defining layer 125 may be made of polyacryl-based resin, polyimide-based resin, or a silicon-based inorganic material.

The emission element layer 300 is disposed on the pixel electrodes 200. The emission element layer 300 may include a hole transferring region 310 disposed on the first electrode 200, an emission layer 320 disposed on the hole transferring region 310, and an electron transferring region 330 disposed on the emission layer 320.

The second electrode 400, e.g., a common electrode 400, may be provided on the emission element layer 300. Accordingly, an organic light emitting diode LD including the pixel electrodes 200, the emission element layer 300, and the common electrode 400 is formed.

The pixel electrode 200 and the common electrode 400 may be formed according to the aforementioned exemplary embodiment of the present disclosure.

An overcoat 190 covering and protecting the common electrode 400 may be formed by an organic layer on the common electrode 400.

A thin film encapsulation layer 121 is formed on the overcoat 190. The thin film encapsulation layer 121 seals and protects the organic light emitting diode LD and a driving circuit formed on the substrate 123.

The thin film encapsulation layer 121 includes organic encapsulation layers 121a and 121c and inorganic encapsulation layers 121b and 121d alternately stacked one by one.

FIG. 8 exemplarily illustrates the configuration of the thin film encapsulation layer 121 by alternately stacking the two organic encapsulation layers 121a and 121c and the two inorganic encapsulation layers 121b and 121d, but it is not limited thereto.

As such, according to an exemplary embodiment of the present disclosure, a display device including the first electrodes 200, which includes the first sub-electrode 210, the second sub-electrode 220, and the barrier layer 230, can improve light efficiency thereof and reduce or minimize the generation of black spots.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. As used herein, the term "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME OF THE SYMBOLS

200: first electrode, pixel electrode
210: first sub-electrode
220: second sub-electrode
230: barrier layer
300: emission element layer
400: second electrode, common electrode

What is claimed is:
1. An organic light emitting element comprising:
a first electrode;
a second electrode overlapping the first electrode;
an emission layer between the first electrode and the second electrode; and
a hole transferring region between the first electrode and the emission layer,
wherein the first electrode comprises:
a first sub-electrode comprising a first metal;
a second sub-electrode on the first sub-electrode and comprising a transparent conductive material; and
a barrier layer on the second sub-electrode and comprising a second metal in a form of an oxide, and
wherein the hole transferring region is on the barrier layer.
2. The organic light emitting element of claim 1, wherein the second metal is a lanthanide metal or a transition metal having a work function that is larger than that of the first metal.
3. The organic light emitting element of claim 2, wherein the work function of the barrier layer is equal to or greater than about 5.40 eV.
4. The organic light emitting element of claim 2, wherein the first metal is at least one selected from the group consisting of silver (Ag), gold (Au), aluminum (Al), copper (Cu), a silver alloy, a gold alloy, an aluminum alloy, and a copper alloy.
5. The organic light emitting element of claim 4, wherein the second sub-electrode comprises at least one selected from an indium oxide, a tin oxide, a zinc oxide, a gallium oxide, and a silicon oxide.

6. The organic light emitting element of claim 5, wherein the barrier layer comprises an ytterbium oxide or a samarium oxide.

7. The organic light emitting element of claim 5, wherein a thickness of the barrier layer is in a range of 1 nm to 15 nm.

8. The organic light emitting element of claim 5, wherein the first electrode is a light-reflective electrode, and the second electrode is a light-transflective electrode.

9. The organic light emitting element of claim 5, further comprising:

an electron transferring region between the emission layer and the second electrode.

10. The organic light emitting element of claim 9, wherein the hole transferring region comprises a hole-injection layer and a hole-transporting layer, and the electron transferring region comprises an electron-transporting layer and an electron-injection layer.

11. The organic light emitting element of claim 9, wherein the emission layer comprises any one of a red organic emission layer, a green organic emission layer, a blue organic emission layer, and a white organic emission layer.

12. An organic light emitting element comprising:

a first electrode;

a second electrode overlapping the first electrode;

an emission layer between the first electrode and the second electrode; and a pixel defining layer having an opening exposing the first electrode, wherein the first electrode comprises:

a first sub-electrode comprising a first metal;

a second sub-electrode on the first sub-electrode and comprising a transparent conductive material; and a barrier layer on the second sub-electrode and comprising a second metal in a form of an oxide, and wherein a portion of the pixel defining layer is on the barrier layer.

* * * * *